(12) United States Patent
Sasaki et al.

(10) Patent No.: US 7,463,026 B2
(45) Date of Patent: Dec. 9, 2008

(54) MAGNETIC SENSOR INCLUDING BRIDGE CIRCUIT HAVING FIXED RESISTANCE LIKE STRUCTURE OF ELEMENT

(75) Inventors: Shinichi Sasaki, Niigata-ken (JP); Kiyoshi Sato, Niigata-ken (JP); Naoya Hasegawa, Niigata-ken (JP); Yoshito Sasaki, Niigata-ken (JP); Eiji Umetsu, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 11/679,083

(22) Filed: Feb. 26, 2007

(65) Prior Publication Data

US 2008/0024120 A1 Jan. 31, 2008

(30) Foreign Application Priority Data

Jul. 26, 2006 (JP) ............................. 2006-203716

(51) Int. Cl.
*G01R 33/09* (2006.01)
*G01B 7/14* (2006.01)
*H01L 43/08* (2006.01)

(52) U.S. Cl. .................................. 324/252; 324/207.21

(58) Field of Classification Search ............ 324/207.21, 324/252; 338/32 R; 360/313, 314, 315, 360/324, 324.1, 324.11, 324.2
See application file for complete search history.

(56) References Cited

U.S. PATENT DOCUMENTS 7,023,310 B2* 4/2006 Oohashi et al. ............. 335/306
2008/0054888 A1* 3/2008 Ando et al. ............ 324/207.21

FOREIGN PATENT DOCUMENTS

JP 8-17311 1/1996
JP 2003-60256 2/2003

* cited by examiner

*Primary Examiner*—Kenneth J Whittington
(74) *Attorney, Agent, or Firm*—Brinks Hofer Gilson & Lione (57) ABSTRACT

A magnetic sensor uses a magnetoresistance element which can be driven in a stable manner with a dipole irrespective of a polarity of an external magnetic field. A resistance value R of first magnetoresistance elements varies, and a resistance value of second magnetoresistance elements does not vary with a variation in magnetic field magnitude of the external magnetic field H1 in the positive direction. A resistance value R of second magnetoresistance elements varies and a resistance value of first magnetoresistance elements does not vary with a variation in magnetic field magnitude of the external magnetic field H2 in the negative direction. Accordingly, the magnetic sensor can be driven in a stable manner with a dipole irrespective of the polarity of the external magnetic field.

7 Claims, 10 Drawing Sheets

MAGNETIC SENSOR INCLUDING BRIDGE CIRCUIT HAVING FIXED RESISTANCE LIKE STRUCTURE OF ELEMENT

This patent document claims the benefit of Japanese Patent Application No. 2006-203716 filed on Jul. 26, 2006, which is hereby incorporated by reference.

BACKGROUND

1. Field

The present embodiments relate to a non-contact magnetic sensor including a magnetoresistance element, and more particularly, to a magnetoresistance element which can be driven in a stable manner with a dipole irrespective of a polarity of an external magnetic field.

2. Related Art

A hall element, a magnetoresistance element, or the like are used in a non-contact magnetic sensor Since in the hall element, power consumption is high and hysteresis does not exist, it is required to install a hysteresis circuit or it is difficult to minimize a size of an element. Accordingly, a magnetic sensor using the magnetoresistance element is noticeable.

Magnetic sensors are used for detecting an open and close states of a foldable cellular phone and the like. For example, in related art, a magnetoresistance element and a fixed resistance element are coupled in series to output a potential, and an on-off switching signal is outputted according to a variation in output on the basis of a variation in magnetic field magnitude of an external magnetic field. When it is detected that the foldable cellular phone opens by outputting an on signal, for example, a backlight under a display is controlled so that the backlight emits light. The related art is disclosed in JP-A-8-17311 and JP-A-2003-60256.

However, in the method for detecting opening and closing, there is a following problem. That is, since a variation in resistance of the magnetoresistance element depends on a polarity of an external magnetic field, a direction of a magnet opposed to the magnetic sensor is limited. When the magnet is disposed in a direction opposite to a positive direction, the polarity of the external magnetic field is inverted and thus the resistance value of the magnetoresistance element is not changed according to the magnetic field magnitude of the external magnetic field in which the polarity is inverted. Accordingly, the open and close detection can not be properly performed.

SUMMARY

The present embodiments may solve the above-mentioned problems, and particularly, an object of the invention is to provide a magnetic sensor using a magnetoresistance element which can be driven in a stable manner with a dipole irrespective of a polarity of an external magnetic field.

In order to accomplish the above-mentioned object, according to an aspect of the invention, there is provided a magnetic sensor comprising a series circuit having a first magnetoresistance element and a second magnetoresistance element connected to each other, of which resistance values vary with a variation in magnetic field magnitude of an external magnetic field, in series and outputting a potential of a connecting portion between the first magnetoresistance element and the second magnetoresistance element. When a direction of the external magnetic field is in a positive direction and a direction opposite to the positive direction is a negative direction, a resistance value of the first magnetoresistance element varies, and the resistance value of the second magnetoresistance element does not vary with a variation in magnetic field magnitude of the external magnetic field in the positive direction. The resistance value of the second magnetoresistance element varies and a resistance value of the first magnetoresistance does not vary with a variation in magnetic field magnitude of the external magnetic field in the negative direction.

In the invention, a magnetic sensor adapted for both magnetic field directions, may be formed irrespective of a polarity of an external magnetic field. Accordingly, the magnetic sensor removes design difficulties, for example associated with a configuration of a magnet generating an external magnetic field.

In the invention, it is preferable that an increasing or decreasing tendency of the resistance variation of the first magnetoresistance element with the variation in magnetic field magnitude in the positive direction may be opposite to an increasing or decreasing tendency of the resistance variation of the second magnetoresistance element with the variation in magnetic field magnitude in the negative direction with respect to a non-magnetic field state of the external magnetic field.

As mentioned above, since the opposite tendency is presented, a variation in potential from the connecting portion may have the same tendency when the external magnetic field is in the positive direction and the negative direction. That is, when the potential from the connecting portion has a tendency to decrease according to increasing a magnetic field magnitude in the positive direction of the external magnetic field, the potential may have the same tendency to decrease according to increasing a magnetic field magnitude in the negative direction of the external magnetic field. Accordingly, a change in circuit or a change in control of a control unit is not specially required.

In the invention, when the external magnetic field is in the positive direction, a fixed resistance value X1 of the second magnetoresistance element may be lager than a minimum resistance value X2 of the first magnetoresistance element varying with a variation in magnetic field magnitude in the positive direction, and may be smaller than a maximum resistance value X3. When the external magnetic field is in the negative direction, a fixed resistance value X4 of the first magnetoresistance element may be lager than a minimum resistance value X5 of the second magnetoresistance element varying with a variation in magnetic field magnitude in the negative direction, and may be smaller than a maximum resistance value X6, and wherein a ratio of 'fixed resistance value X1—minimum resistance value X2 to maximum resistance value X3—fixed resistance value X1' may be equal to a ratio of 'maximum resistance value X6—fixed resistance value X4 to fixed resistance value X4—minimum resistance value X5'. Wherein the fixed resistance value X1 may be a value between the minimum resistance value X2 and the maximum resistance value X3, and the fixed resistance value X4 may be a value between the minimum resistance value X5 and the maximum resistance value X6.

Accordingly, when the external magnetic field acts in the positive direction, there is a time when a varying resistance value of the first magnetoresistance element becomes equal to the fixed resistance value X1 of the second magnetoresistance element. When the external magnetic field acts in the negative direction, there is a time when a varying resistance value of the second magnetoresistance element becomes equal to the fixed resistance value X4 of the first magnetoresistance element. A potential at this time may be a threshold potential for switching the switching signal. In the invention, since the time when the external magnetic field is in the positive direction may be the time when the external magnetic field is in the negative direction, an offset does not exist, and a threshold potential of the magnetic sensor adapting for both the positive and negative magnetic fields is easily controlled, and thus the magnetic sensor can be driven in a stable manner.

In the invention, the first magnetoresistance element and the second magnetoresistance element may have the same film configuration having an anti-ferromagnetic layer, a fixed magnetic layer, a non-magnetic intermediate layer, and a free magnetic layer. An R-H curve in which a abscissa denotes an external magnetic field and a ordinate denotes a resistance value of a magnetoresistance element, a first interlayer-coupling magnetic field Hin1 acting between the fixed magnetic layer and free magnetic layer of the first magnetoresistance element, may be shifted in the positive direction of the external magnetic field, and a second interlayer-coupling magnetic field Hin2 acting between the fixed magnetic layer and the free magnetic layer of the second magnetoresistance element, may be shifted in the negative direction.

As controlled above, a so-called hysteresis loop can be formed in a region in which the external magnetic field is positive in the first magnetoresistance element, and can be formed in a region in which the external magnetic field is negative in the second magnetoresistance element. Accordingly, the magnetic sensor adapting for both the positive and negative magnetic fields can be simply and properly formed in which a resistance value of the first magnetoresistance element varies, and a resistance value of the second magnetoresistance element does not vary with a variation in magnetic field magnitude of the external magnetic field in the positive direction and in which a resistance value of the second magnetoresistance element varies and a resistance value of the first magnetoresistance does not vary with a variation in magnetic field magnitude of the external magnetic field in the negative direction.

In the invention, the first interlayer-coupling magnetic field Hin1 and the second interlayer-coupling magnetic field Hin2 (absolute value) may have the same magnitude.

Accordingly, a resistance value of the magnetoresistance element can be varied at the same time when the external magnetic field is positive and when the external magnetic field is negative, whereby the magnetic sensor is adapted for both the positive and negative field directions can be driven in a stable manner.

By adjusting the interlayer coupling magnetic field described above, in the non-magnetic state of the external magnetic field, a magnetization of the fixed magnetic layer and a magnetization of a free magnetic layer of one of the first magnetoresistance element and the second magnetoresistance element may be in the same direction. A magnetization of the fixed magnetic layer and a magnetization of the free magnetic layer of the other may be in an anti-parallel state, and a magnetization of the fixed magnetic layer of the first magnetoresistance element and a magnetization of the fixed magnetic layer of the second magnetoresistance element may be in the same direction.

In the invention, two first magnetoresistance elements and two first magnetoresistance elements may be provided. The first magnetoresistance element and second magnetoresistance element may constitute a first series circuit, and the other first magnetoresistance element and the other second magnetoresistance element may constitute a second series circuit, wherein the first magnetoresistance element of the first series circuit and the second magnetoresistance element of the second series circuit may be connected in parallel to each other, and the second magnetoresistance element of the first series circuit and the first magnetoresistance element of the second series circuit may be connected in parallel to each other, and wherein a difference between a potential of the connecting portion in the first series circuit and a potential of the connecting portion in the second series circuit may be outputted as a differential voltage.

Accordingly, since a change in potential with a variation in magnetic magnitude of the external magnetic field can increase, a sensitivity of the magnetic sensor is excellent.

In the invention, the magnetic sensor adapted to handle both the positive and negative magnetic fields can be formed irrespective of a polarity of an external magnetic field. Accordingly, a disposition of a magnet generating an external magnetic field is less limited than in the related art and thus the assembly is easier,

BRIEF DESCRIPTION OF THE DRAWINGS

FIG. 10C is an R-H curve in which FIG. 10A and FIG. 10B are coupled.

DESCRIPTION OF THE PREFERRED EMBODIMENTS

Figure 3:
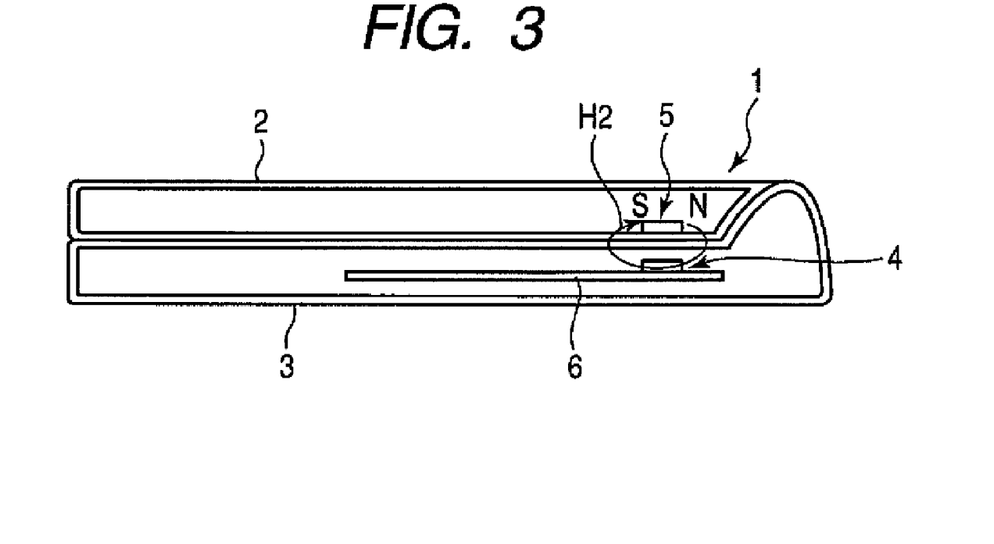
FIG. 3 is a partially schematic view illustrating a foldable cellular phone including a magnetic sensor of an embodiment when an external magnetic field H2 acts in a negative direction (closing state).
Figure 4:
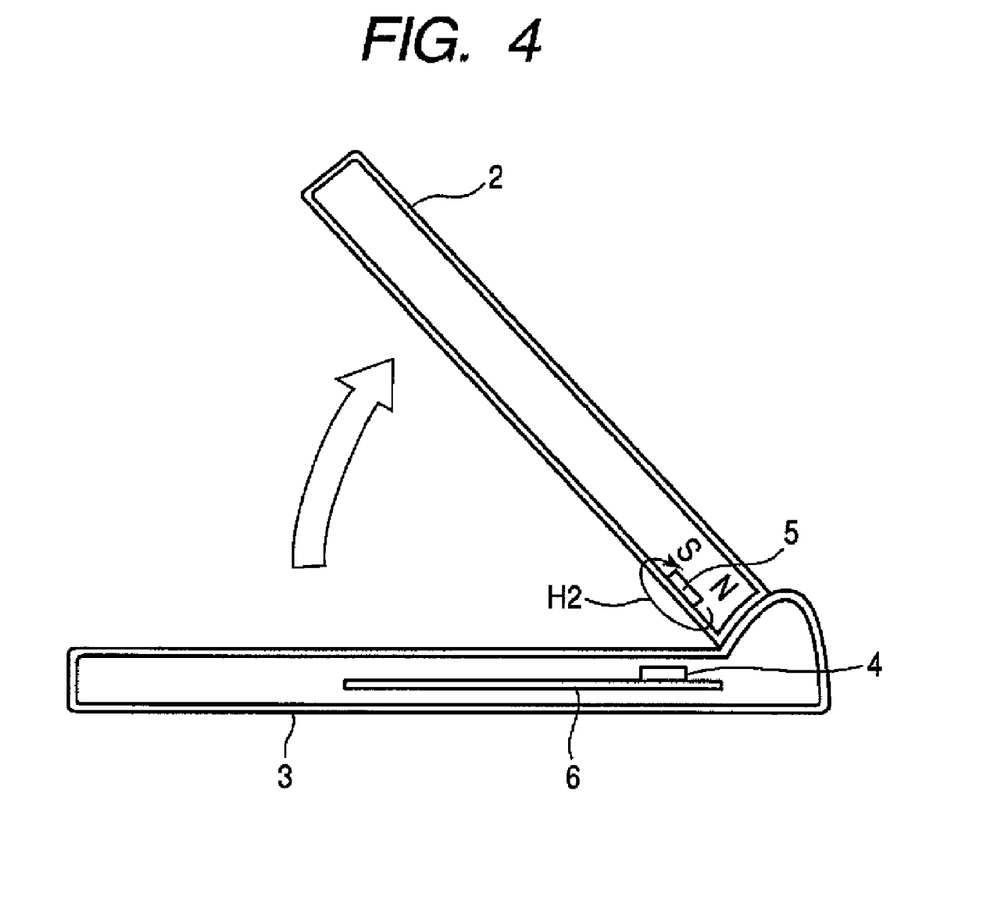
FIG. 4 is a partially schematic view illustrating a foldable cellular phone including a magnetic sensor of an embodiment when an external magnetic field H2 acts in a negative direction (opening state).
Figure 5:
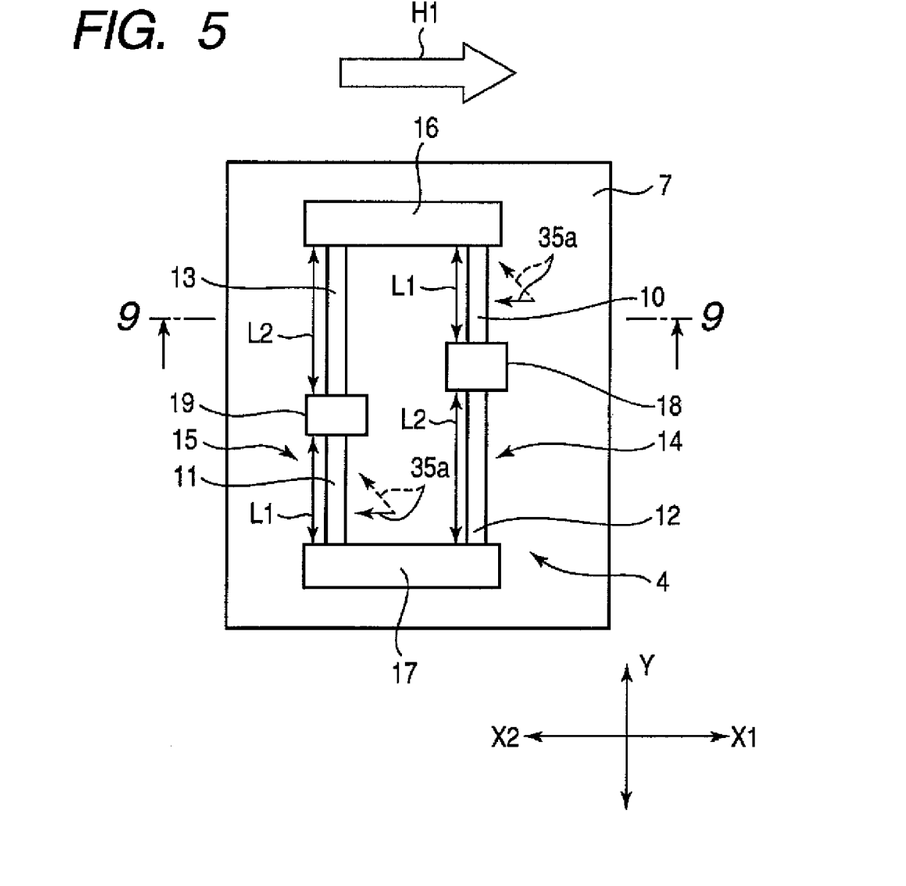
FIG. 5 is a partially plan view illustrating a magnetic sensor of an embodiment when an external magnetic field H1 acts in a positive direction.
Figure 6:
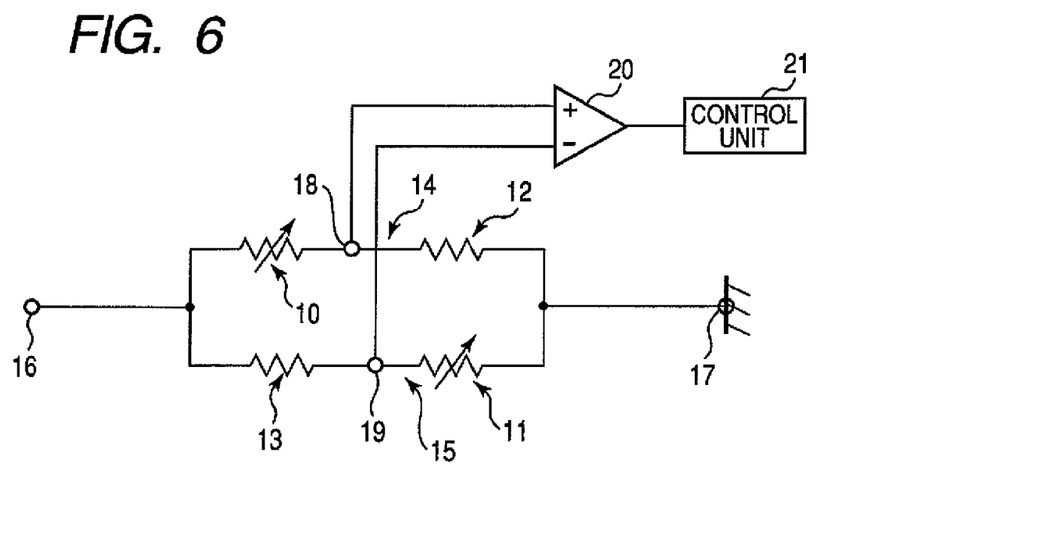
FIG. 6 is a circuit diagram of the magnetic sensor in FIG. 5.
Figure 7:
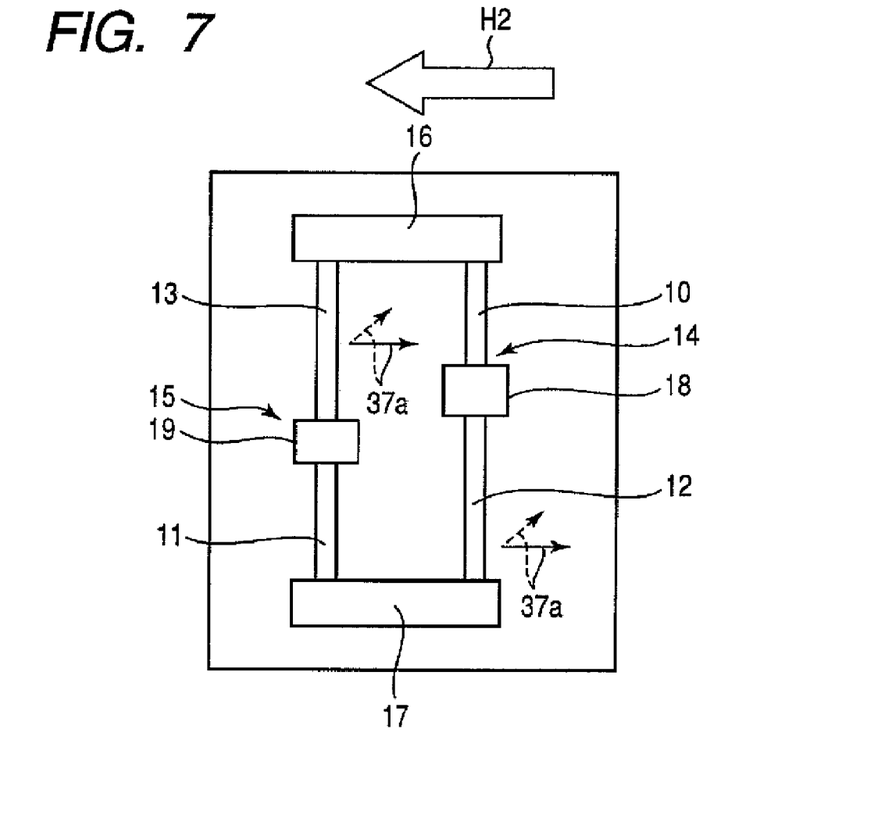
FIG. 7 is a partially plan view illustrating a magnetic sensor of an embodiment when an external magnetic field H2 acts in a negative direction.
Figure 8:
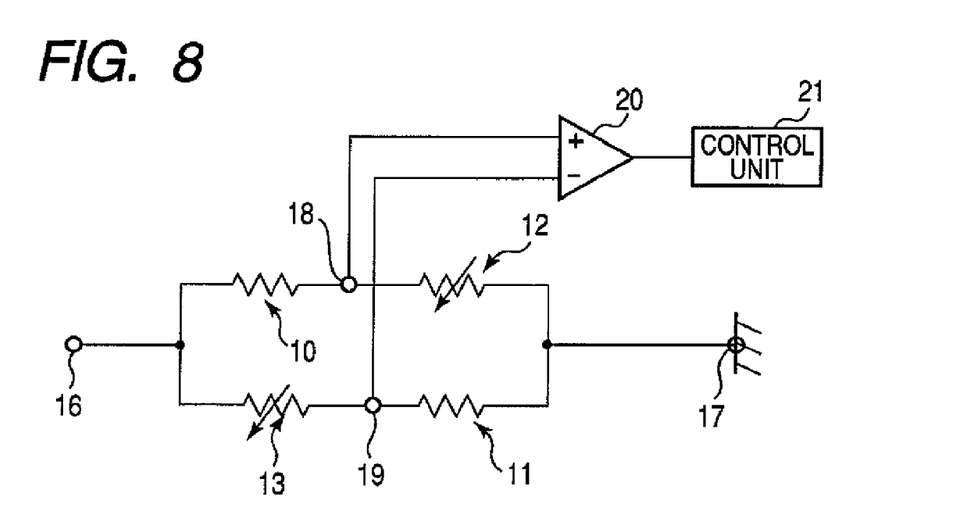
FIG. 8 is a circuit diagram of the magnetic sensor in FIG. 7.
Figure 9:
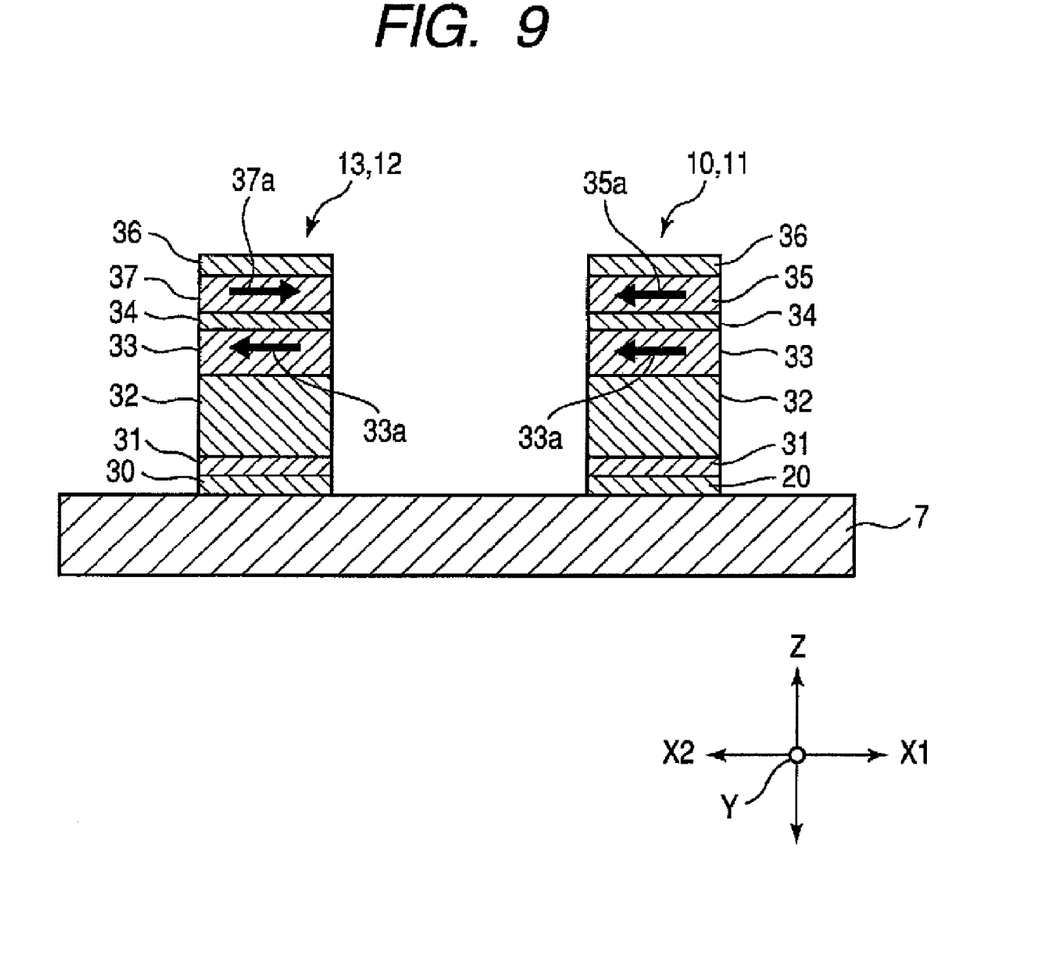
FIG. 9 is a partially sectional view illustrating the magnetic sensor as viewed from a direction taken along Line A-A in FIG. 5.
Figure 10A:
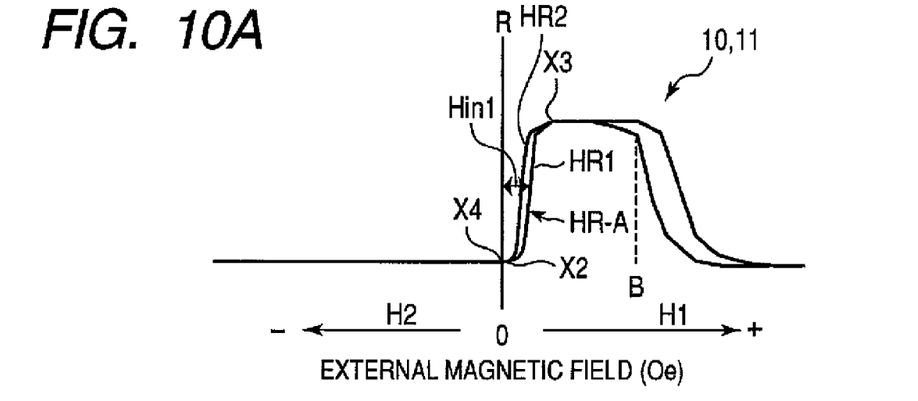
FIG. 10A is an R-H curve illustrating a hysteresis characteristic of a first magnetoresistance element.
Figure 10B:
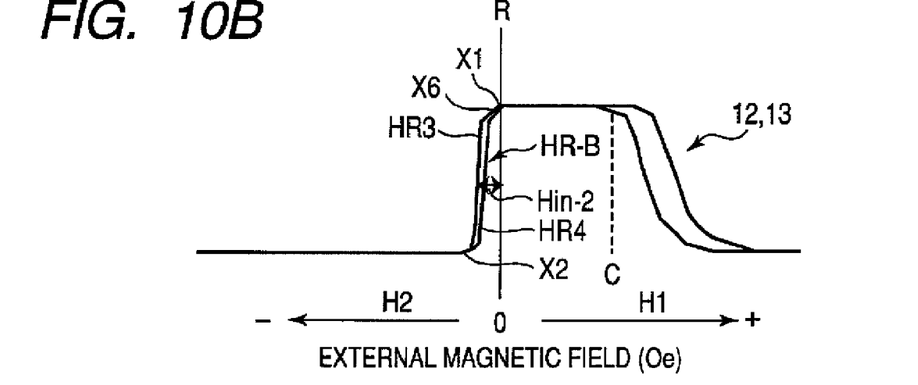
FIG. 10B is an R-H curve illustrating a hysteresis characteristic of a second magnetoresistance element.
Figure 10C:
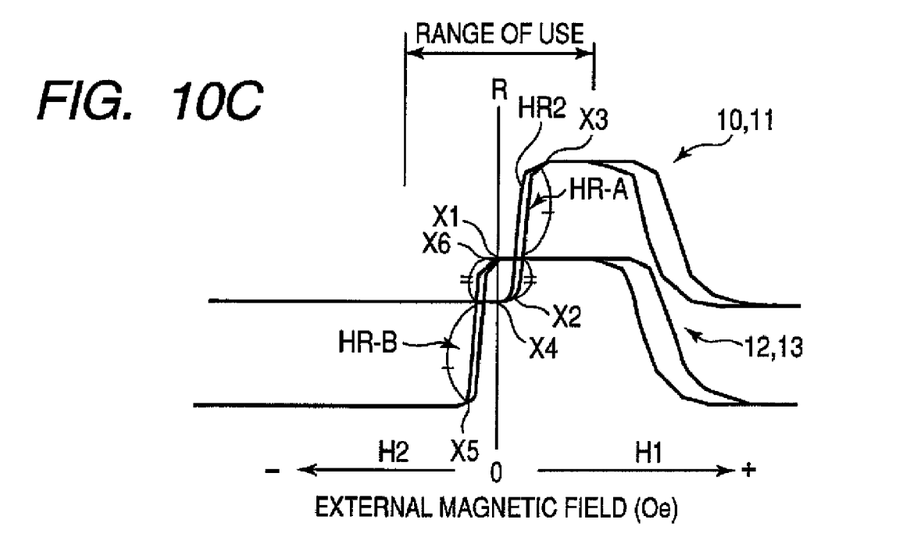
Figure 11:
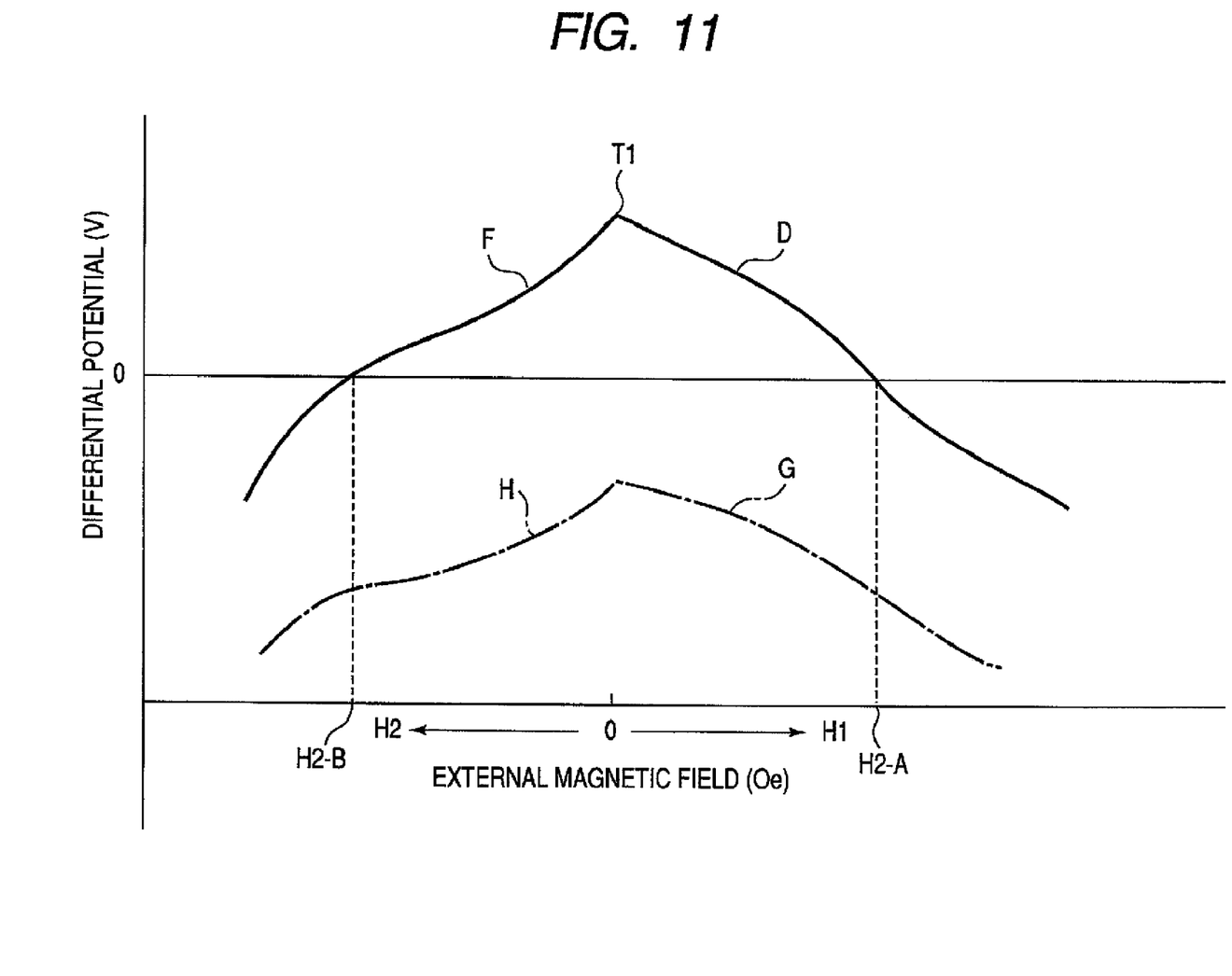
FIG. 11 is a graph illustrating a relation between an external magnetic field H and a differential potential.
Figure 12:
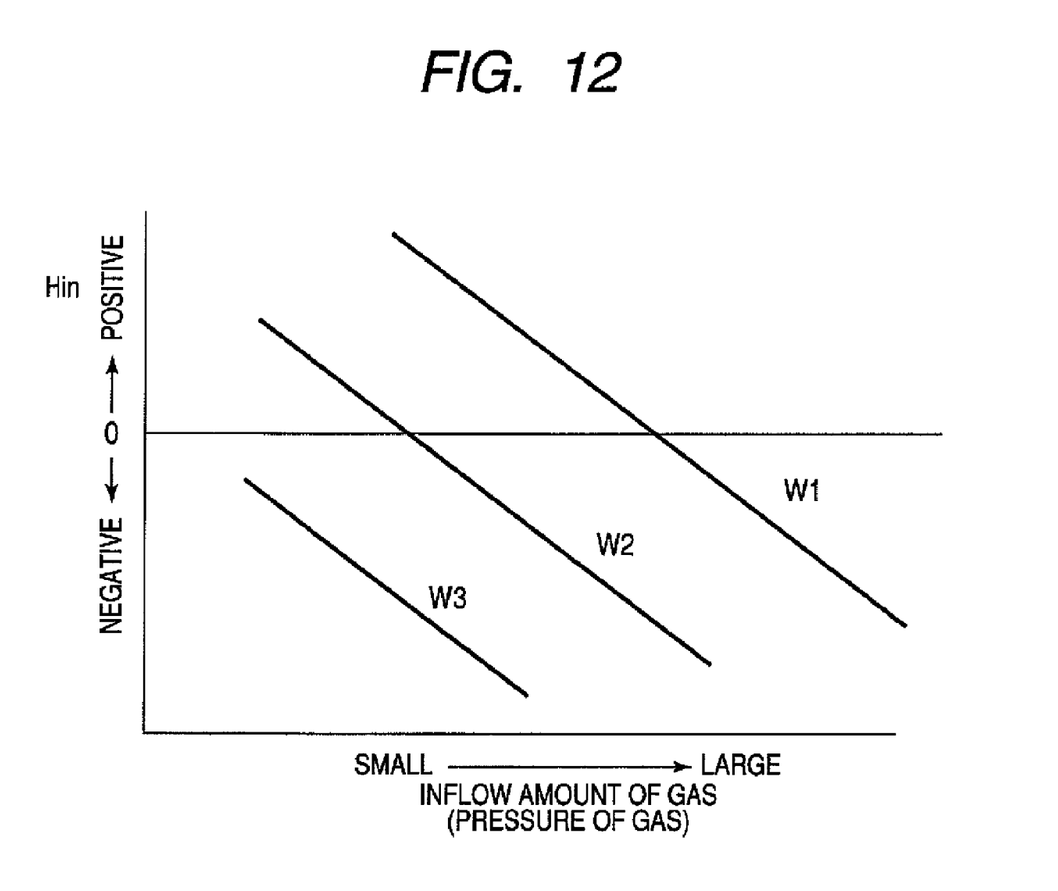
FIG. 12 is a graph illustrating a relation among a gas inflowing amount (gas pressure) and a power and an interlayer-coupling magnetic field Hin.

FIGS. 1 to 4 are a partial schematic views illustrating a foldable cellular phone including a non-contact magnetic sensor of the embodiment. FIGS. 5 and 7 are a partial plan views illustrating a non-contact magnetic sensor of the embodiment. FIGS. 6 and 8 are a circuit diagram of a magnetic sensor. FIG. 9 is a partial sectional view illustrating the non-contact magnetic sensor as viewed from a direction taken along Line A-A in FIG. 5. FIG. 10A is a graph (R-H curve) illustrating a hysteresis characteristic of a first magnetoresistance element. FIG. 10B is a graph (R-H curve) illustrating a hysteresis characteristic of a second magnetoresistance element. FIG. 10C is a graph (R-H curve) in which FIG. 10A is coupled with FIG. 10B. FIG. 11 is a graph illustrating a relation between an external magnetic field H and a differential potential, and FIG. 12 is a graph illustrating a relation among a gas pressure and power and an interlayer-coupling magnetic field Hin during a plasma treatment.

Figure 1:
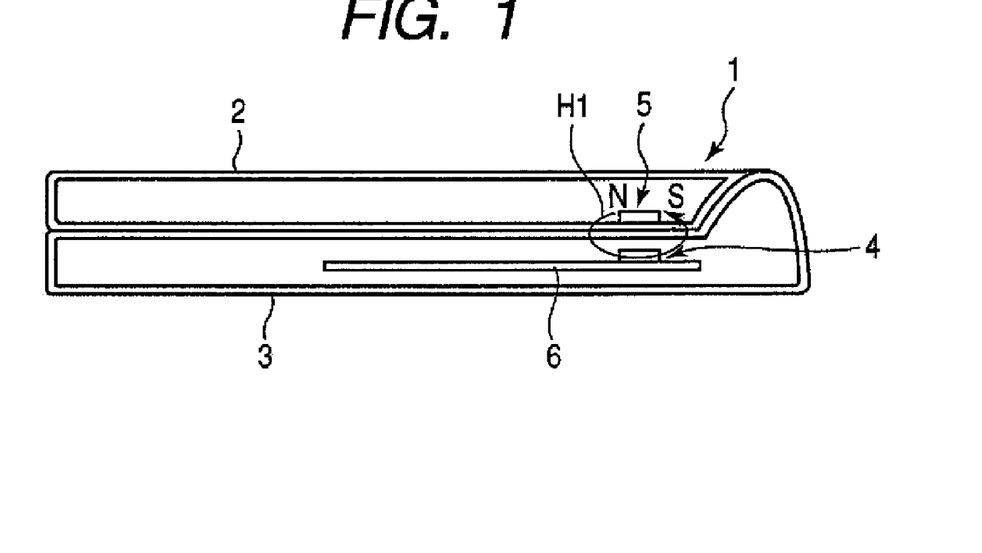
FIG. 1 is a partially schematic view illustrating a foldable cellular phone including a magnetic sensor of an embodiment when an external magnetic field H1 acts in a positive direction (closing state).

As shown in FIG. 1, a foldable cellular phone 1 includes a first member 2 and a second member 3. The first member 2 is screen display portion and the second member 3 is a manipulation portion. A liquid crystal display or a receiver or the like is provided on a surface of the first member 2 opposite the second member 3. Various buttons, a microphone, and the like are provided on a surface of the second member 3 opposite the first member 2. FIG. 1 illustrates a closing state of the foldable cellular phone 1. As shown in FIG. 1, a magnet 5 is built in the first member 2 and a magnetic sensor 4 is built in the second member 3. The magnet 5 and the magnetic sensor 4 face each other in the closing state shown in FIG. 1. Alternatively, the magnetic sensor 4 may be disposed at a position departing from the direction parallel to an application direction of the external magnetic field other than the position facing the magnet 5.

In FIG. 1, the external magnetic field H1 emitted from the magnet 5 acts on the magnetic sensor 4, and the magnetic sensor 4 detects the external magnetic field H1, whereby the closing state of the foldable cellular phone 1 is detected.

Figure 2:
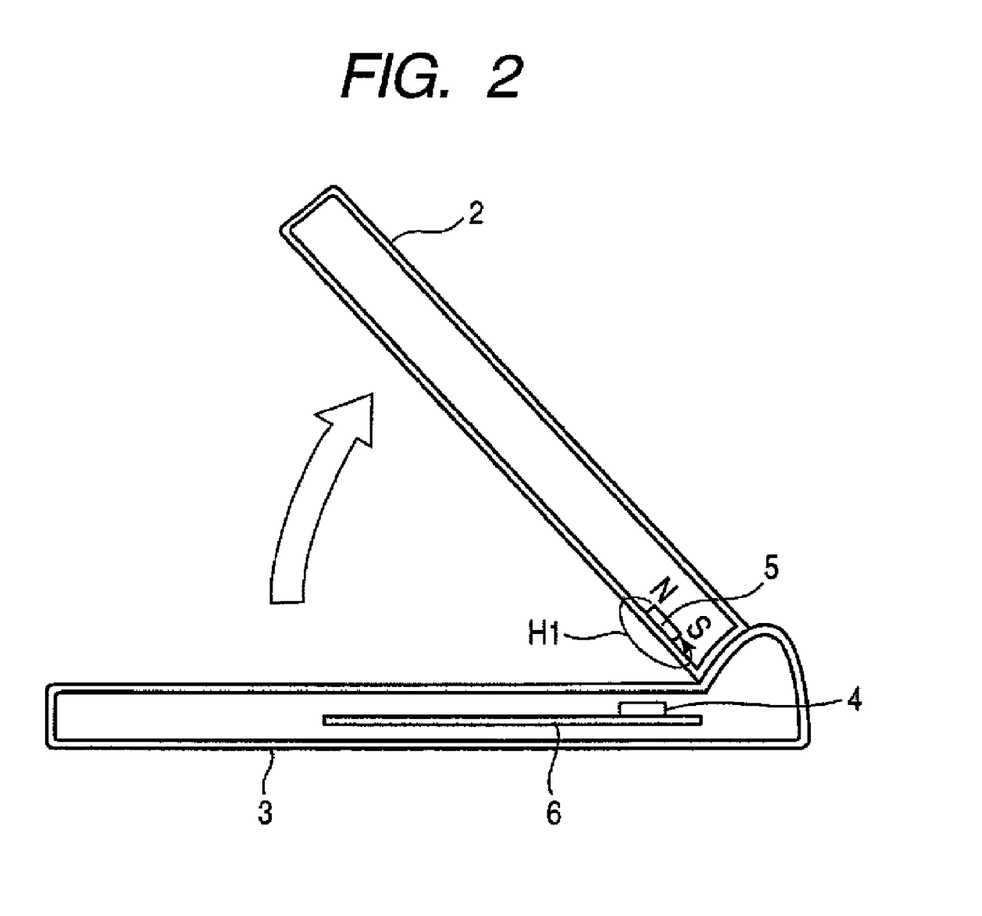
FIG. 2 is a partially schematic view illustrating a foldable cellular phone including a magnetic sensor of an embodiment when an external magnetic field H1 acts in a positive direction (opening state).

Meanwhile, when the foldable cellular phone 1 is in an opening position as shown in FIG. 2, the first member 2 is gradually move apart from the second member 3, accordingly the magnitude of the external magnetic field H1 which acts on the magnetic sensor 4 becomes gradually smaller, and thus the magnitude of the external magnetic field H1 acting on the magnetic sensor 4 becomes zero. When the magnitude of the external magnetic field H1 acting on the magnetic sensor 4 is a predetermined value or less, the opening state of the foldable cellular phone 1 is detected. For example, a control unit built in the foldable cellular phone 1 controls a backlight in the rear of the liquid crystal display or the manipulation buttons so as to emit light.

The magnetic sensor 4 of the embodiment is the sensor adapting for both the positive and negative magnetic fields. That is, in FIG. 1, an N pole of the magnet 5 is located on the left of a figure of the magnet and an S pole is located on the right of a figure. However, as shown in FIG. 3, when the polarity is inversely disposed (N pole is right of figure and S pole is left of figure), a direction of the external magnetic field H2 acting on the magnetic sensor 4 is inverted to a direction of the external magnetic field H1 in FIG. 1. In the embodiment, in the above-mentioned case, the opening operation is properly detected when the cellular phone 1 is opened according to FIG. 4 from the closing state according to FIG. 3.

As shown in FIG. 5, the magnetic sensor 4 of the embodiment is mounted on the circuit board 6 built in the second member 3. In the magnetic sensor 4, two first magnetoresistance elements 10, 11 and two second magnetoresistance elements 12, 13 are disposed on a single element base 7.

As shown in FIG. 5, the magnetoresistance elements 10 to 13 constitute a bridge circuit. The first magnetoresistance element 10 and the second magnetoresistance 12 connected in series constitute a first series circuit 14. The first magnetoresistance element 11 and the second magnetoresistance 13 connected in series constitute a second series circuit 15.

The first magnetoresistance element 10 of the first series circuit 14 and the second magnetoresistance element 13 of the second series circuit 15 are connected in parallel, and the connecting portion is an input terminal 16. The second magnetoresistance element 12 of the first series circuit 14 and the first magnetoresistance element 11 of the second series circuit 15 are connected in parallel and the connecting portion is an earth terminal or ground 17.

As shown in FIG. 5, a first connecting portion between the first magnetoresistance element 10 of the first series circuit 14 and the second magnetoresistance element 12 is a first output terminal 18, and a second connecting portion between the first magnetoresistance element 11 of the second series circuit 15 and the second magnetoresistance element 13 is a second output terminal 19. The terminals 16 to 19 are electrically connected to terminals (not shown) on the circuit board 6 by a wire bonding, a die bonding, or the like.

As shown in FIG. 6, the first output terminal 18 and the second output terminal 19 are connected to a differential amplifier (OP-AMP) 20, which is connected to a control unit 21.

The first magnetoresistance elements 10, 11 and the second magnetoresistance elements 12, 14 have a film configuration as followings.

As shown in FIG. 9, the first magnetoresistance element 10 (11) and the second magnetoresistance element 13 (12) are laminated in an order of an underlying layer 30, a seed layer 31, an anti-ferromagnetic layer 32, a fixed magnetic layer 33, a non-magnetic intermediate layer 34, free magnetic layers 35, 37 (a free magnetic layer of the second magnetoresistance element 13 denotes reference numeral 37), and a protection layer 36 from the bottom. The underlying layer 30, for example, is formed of one or more non-magnetic materials such as Ta, Hf, Nb, Zr, Ti, Mo, and W. The seed layer 31 is formed of NiFeCr, or Cr, or the like. The anti-ferromagnetic layer 32 is formed of anti-ferromagnetic materials containing an element $\alpha$ (i.e. $\alpha$ is one or more elements of Pt, Pd, Ir, Rh, Ru, and Os) and Mn or anti-ferromagnetic materials containing an element $\alpha$, an element $\alpha'$ (i.e. $\alpha'$ is one or more elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth element), and Mn. For example, the anti-ferromagnetic layer 32 is formed of IrMn or PtMn. The fixed magnetic layer 33 and the free magnetic layers 35, 37 are formed of materials such as CoFe alloy, NiFe alloy, and CoFeNi alloy. The non-magnetic intermediate layer 34 is formed of non-magnetic conductive materials such as Cu. When a Tunnel magnetoresistance element is used, the non-magnetic intermediate layer 34 is formed of an insulation-barrier layer such as TiOx. The protection layer 36 is formed of Ta and the like. The fixed magnetic layer 33 or the free magnetic layers 35, 37 may have a laminated ferri structure (a structure in which a magnetic layer/a non-magnetic layer/a magnetic layer are laminated and a structure in which a non-magnetic layer is interposed between two magnetic layers of which magnetization directions are anti-parallel with each other). The fixed magnetic layer 33 or the free magnetic layers 35, 37 may be a laminated structure formed of a plurality of magnetic layers with different materials.

In the first magnetoresistance element 10 and the second magnetoresistance element 13, the anti-ferromagnetic layer 32 and the fixed magnetic layer 33 are contacted. Accordingly, when a magnetic field acts, a heat treatment is performed, whereby an exchange coupling magnetic field (Hex) is generated on an interface between the anti-ferromagnetic layer 32 and the fixed magnetic layer 33. Therefore, a magnetization direction of the fixed magnetic layer 33 is fixed in one direction. In FIG. 9, the magnetization direction 33a of the fixed magnetic layer 33 is shown by an arrow. In the first magnetoresistance element 10 (11) and the second magnetoresistance element 13 (12), all magnetization directions 33a of the fixed magnetic layers 33 are shown in a direction denoted as X2.

Meanwhile, magnetization directions of the free magnetic layers 35, 37 are different in the first magnetoresistance element 10 and in the second magnetoresistance element 13. As shown in FIG. 7, in the first magnetoresistance element 10 (11), a magnetization direction 35a of the free magnetic layer 35 is a shown in the direction denoted by X2, and is the same as the magnetization direction 33a of the free magnetic layer 33. However, in the second magnetoresistance element 13 (12), a magnetization direction 37a of the free magnetic layer 37 is a shown in the direction denoted by X1, and is anti-parallel to the magnetization direction 33a of the free magnetic layer 33.

As shown in FIG. 5, the external magnetic field H1 shown in FIGS. 1 and 2 acts on the magnetic sensor 4 from the shown X2 direction to the shown X1 direction. A direction of the external magnetic field H1 is "a positive direction (+direction)". Meanwhile, in FIG. 7, the external magnetic field H2 shown in FIGS. 3 and 4 acts on the magnetic sensor 4 shown in the X1 to the X2 direction, and a direction of the external magnetic field H2 is "a negative direction (−direction)".

As shown in FIG. 5, when the external magnetic field (magnetic field in the positive direction) H1 acts on the magnetic sensor 4, the magnetization 35a of the free magnetic layer 35 magnetized in a direction opposite to the direction of the external magnetic field H1 varies, and thus the resistance values of the first magnetoresistance elements 10, 11 vary. FIG. 10A is an R-H curve illustrate a hysteresis characteristic of the first magnetoresistance elements 10, 11. In the graph, a longitudinal axis denotes a resistance value R, but may be a resistance variation rate (%). As shown in FIG. 10A, when the external magnetic field H1 gradually increases from the non-magnetic field state (zero) to the positive direction, the resistance value R of the first magnetoresistance elements 10, 11 gradually increases along the curve HR1. A minimum resistance value at a point in which the resistance value R varies is X2. Meanwhile, a maximum resistance value at a point in which the resistance value R varies is X3. When the external magnetic field H1 decreases from the maximum resistance value X3, the resistance value R of the first magnetoresistance elements 10, 11 gradually decreases along a curve HR2 and finally reaches the minimum resistance value X2. Thus, in the first magnetoresistance elements 10, 11, with respect to a variation in magnetic field magnitude of the external magnetic field H1 in the positive direction, a hysteresis loop (HR-A) depicted with the curve HR1 and the curve HR2 is formed. A "central point" of the hysteresis loop HR-A is a middle value between the maximum resistance value X3 and the minimum resistance value X2 and a central value of a spreading width of the hysteresis loop HR-A. The magnitude of the first interlayer coupling magnetic field Hin1 is determined by the magnetic field magnitude from the center point of the hysteresis loop HR-A to the external magnetic field H=0 (Oe). In addition, the second interlayer coupling magnetic field Hin2 in FIG. 10B can be obtained in the same manner. The spreading width passing through the central point of the hysteresis loop HR-A is double the coercive force. When the coercive force is very small, a chattering may be easily generated. Accordingly, it is preferable that the coercive force is large. The coercive force is adjusted at 2.5 Oe or so.

As shown in FIG. 10A, in the first magnetoresistance elements 10, 11, the first interlayer coupling magnetic field Hin1 is shifted in the positive direction of the magnetic field. When the external magnetic field H1 in the positive direction increases, the magnetic magnitude of the external magnetic field H1 keeps the maximum resistance value X3 up to B. However, when the external magnetic field H1 further increases, the magnetization 33a of the fixed magnetic layer 33 varies in the direction of the external magnetic field H1 and is toward the same direction as the magnetization 35a of the free magnetic layer 35. Accordingly, the resistance value R becomes gradually smaller. However, in practical use, the magnet 5 in which the external magnetic field H1 becomes lager than the magnetic field magnitude is not used.

Meanwhile, as shown in FIG. 7, when the external magnetic field H2 acts in the negative direction, since the direction of the external magnetic field H2 is equal to the direction of the magnetization 35a of the free magnetic layer 35 of the first magnetoresistance elements 10, 11 in a non-magnetic field state (the external magnetic field is zero), the free magnetic layer 35 does not vary in accordance with the external magnetic field H2 in the negative direction and the magnetization 35a of the free magnetic layer 35 and the magnetization 33a of the fixed magnetic layer 33 keep the equilibrium state. Consequently, as shown in FIG. 10A, the resistance value R of the first magnetoresistance elements 10, 11 keeps a constant value (fixed resistance value) X4 with respective to the external magnetic field H2 in the negative direction.

Next, a hysteresis characteristic of the second magnetoresistance elements 12, 13 is described. As shown in FIG. 5, when the external magnetic field (magnetic field in the positive direction) H1 acts on the magnetic sensor 4, the magnetization 37a of the free magnetic layer 37 magnetized in the same direction as the direction of the external magnetic field H1 does not varies. Accordingly, as shown in FIG. 10B, even when the external magnetic field H2 increases from zero in the positive direction, the second magnetoresistance elements 12, 13 keep a constant value (fixed resistance value) X1. However, when the magnetic field magnitude of the external magnetic field H1 increases by more than C, the magnetization 33a of the fixed magnetic layer 33 of the second magnetoresistance element 12, 13 is inverted in the direction of the external magnetic field H1. Accordingly, the resistance value R of the second magnetoresistance elements 12, 13 decreases. However, as described in FIG. 10A, in practical use, the magnet 5 in which the external magnetic field H1 increases more than the magnetic field magnitude C is not used.

As shown in FIG. 7, when the external magnetic field H2 acts in the negative direction, since the direction of the external magnetic field H2 is anti-parallel to the direction of the magnetization 37a of the free magnetic layer 37 of the second magnetoresistance elements 12, 13, the magnetization 37a of the free magnetic layer 37 has an influence of the external magnetic field H2, and thus varies. In the non-magnetic field state of the external magnetic field, as shown in FIG. 9, since the magnetization 33a of the fixed magnetic layer 33 of the second magnetoresistance elements 12, 13 is anti-parallel to the magnetization 37a of the free magnetic layer 37, the resistance value R has a high resistance value. However, when the external magnetic field H2 (absolute value) gradually increases, and thus the magnetization 37a of the free magnetic layer 37 is inverted, the magnetization 37a of the free magnetic layer 37 becomes similar to the magnetization 33a of the fixed magnetic layer 33. Accordingly, the resistance value R of the second magnetoresistance elements 12, 13 gradually decrease along the curve HR3. A minimum resistance value at the portion in which the resistance value R varies is denoted X5 and a maximum resistance value at the portion in which the resistance value R varies is denoted by X6. When the external magnetic field H2 (absolute value) gradually decreases in the negative direction from the position of the maximum resistance value X5 (i.e. when the external magnetic field becomes close to zero), the resistance value R of the second magnetoresistance elements 12, 13 gradually increases along the curve HR4, and thus reaches the maximum resistance value X6. Consequently, a hysteresis loop HR-B surrounded with the curve HR3 and the curve HR4 is formed.

As shown in FIG. 10B, a second interlayer coupling magnetic field Hin2 of the second magnetoresistance elements 12, 13 is shifted in the negative magnetic field.

As mentioned above, in the embodiment, on the R-H curve, the first interlayer coupling magnetic field Hin1 of the first magnetoresistance elements 10, 11 is shifted in the positive direction of the external magnetic field, and the second interlayer coupling magnetic field Hin2 of the second magnetoresistance elements 12, 13 is shifted in the negative direction of the external magnetic field. Accordingly, since the shift directions are different each other, the magnetic sensor 4 adapting for both the positive and negative magnetic fields can be made.

The principal is described with reference to FIG. 10C. FIG. 10C is a graph in which the hysteresis characteristic of the first magnetoresistance elements 10, 11 shown in FIG. 10A and the hysteresis characteristic of the second magnetoresistance elements 12, 13 shown in FIG. 10B. Both are shown on the same R-H curve.

As shown in FIG. 10C, it is supposed that the magnetic field magnitude of the external magnetic field varies within "use range."

First of all, as shown in FIG. 10C, in the external magnetic field H, when the external magnetic field H1 gradually increases from the non-magnetic field state (zero position) in the positive direction, the resistance value R of the first magnetoresistance elements 10, 11 varies at the position of the hysteresis loop (HR-A). As for the variation in magnitude of the external magnetic field H1 in the positive direction in which the resistance value of the first magnetoresistance elements 10, 11 varies, the second magnetoresistance elements 12, 13 do not vary (fixed resistance value) X1. That is, the second magnetoresistance elements 12, 13 function as the fixed resistance element with respect to the external magnetic field H1 in the positive direction. Accordingly, as shown in circuit diagram of FIG. 6, the first magnetoresistance elements 10, 11 function as a variable resistance element with the variation in magnitude of the external magnetic field H1 in the positive direction and the second magnetoresistance elements 12, 13 function as a fixed resistance element keeping constant resistance value X1. Accordingly, when the magnitude of the external magnetic field H1 varies in the positive direction, a voltage from a first output terminal 18 of a first series circuit 14 and a voltage from a second output terminal 19 of a second series circuit 15 vary.

Meanwhile, as shown in FIG. 10C, in the external magnetic field H, when the external magnetic field H2 (absolute value) gradually increases from the non-magnetic field state (zero position) in the negative direction, the resistance value R of the first magnetoresistance elements 10, 11 varies at the position of the hysteresis loop (HR-A). As for the variation in magnitude of the external magnetic field H2 in the negative direction in which the resistance value of the first magnetoresistance elements 12, 13 varies, the first magnetoresistance elements 10, 11 keep a constant resistance value (fixed resistance value) X4. That is, the first magnetoresistance elements 10, 11 function as the fixed resistance element with respect to the external magnetic field H2 in the negative direction. Accordingly, as shown in circuit diagram of FIG. 8, the second magnetoresistance elements 12, 13 function as a variable resistance element with the variation in magnitude of the external magnetic field H2 in the negative direction, and the first magnetoresistance elements 10, 11 function as a fixed resistance element keeping constant resistance value X4. Accordingly, when the magnitude of the external magnetic field H2 varies in the negative direction, a voltage from a first output terminal 18 of a first series circuit 14 and a voltage from a second output terminal 19 of a second series circuit 15 vary.

In the embodiment as described above, with respect to the external magnetic field in both of the positive direction and the negative direction, since the output can be obtained from the magnetic sensor 4, the magnetic sensor functions as the magnetic sensor adapting for both the positive and negative magnetic fields. Accordingly, although the magnet 5 generating the external magnetic fields H1, H2 is disposed in the direction as shown in FIGS. 1 and 2 or is disposed in the opposite direction as shown in FIGS. 3 and 4, both directions may correspond each other. Since the manner of disposition of the magnet 5 is not limited in comparison with the related art, it is convenient to mount the magnetic sensor 4 and the magnet 5 in the apparatus.

In the embodiment, as described in FIG. 10A, the first interlayer coupling magnetic field Hin1 of the first magnetoresistance elements 10, 11 is shifted in the positive direction, and as described in FIG. 10B, and the second interlayer coupling magnetic field Hin2 is shifted in the negative direction. In the embodiment, as described in FIG. 9, in the first magnetoresistance elements 10, 11, the magnetization 33a of the fixed magnetic layer 33 and the magnetization 33a of the free magnetic layer 35 are parallel each other and are in the same direction as the external magnetic field H2 from the X1 direction to the X2 direction, that is, in the negative direction. Meanwhile, in the second magnetoresistance elements 12, 13, the magnetization 33a of the fixed magnetic layer 33 is anti-parallel to the magnetization 37a of the free magnetic layer 37, the magnetization 33a of the fixed magnetic layer 33 is the same direction as the magnetization 33a of the fixed magnetic layer 33 of the first magnetoresistance elements 10, 11, and the magnetization 37a of the free magnetic layer 37 is a direction from X2 to X1, that is, the same direction as the external magnetic field H1.

As described in FIGS. 10A and 10B, the interlayer coupling magnetic fields Hin1, Hin2 which are opposite each other are obtained. In order to obtain the magnetization state shown in FIG. 9, a gas flow (gas pressure) or an electric power should be properly adjusted when a plasma treatment (PT) performed on the surface of the non-magnetic intermediate layer 23.

As shown in FIG. 12, it can be seen that the interlayer coupling magnetic field Hin varies in accordance with a magnitude of a gas flow (gas pressure) and a magnitude of an electric power. The magnitude of the electric power shown in FIG. 12 is W1>W2>W3 and in the range of 100W to 300W. As shown in FIG. 12, when the gas flow (gas pressure) and the electric power increases, the interlayer coupling magnetic field Hin can vary from a positive value to a negative value. Accordingly, by adjusting the gas flow or the electric power for the plasma treatment on the first magnetoresistance elements 10, 11 and the gas flow or the electric power for the plasma treatment on the second magnetoresistance elements 12, 13, the first interlayer coupling magnetic field Hin1 of the first magnetoresistance elements 10, 11 may be shifted in the positive direction, and the second interlayer coupling magnetic field Hin2 of the second magnetoresistance elements 12, 13 may be shifted in the negative direction.

The magnitude of the interlayer coupling magnetic field Hin varies also in the non-magnetic intermediate layer 34. The magnitude of the interlayer coupling magnetic field Hin may be adjusted by changing the film thickness of the anti-ferromagnetic layer when the anti-ferromagnetic layer/the fixed magnetic layer/non-magnetic intermediate layer/free magnetic layer are laminated in an order thereof from bottom.

In the first magnetoresistance element 10, 11, the first interlayer coupling magnetic field Hin1 is the positive value and in this case, an interaction which makes the opposite magnetizations to be parallel acts between the fixed magnetic layer 33 and the free magnetic layer 35. In the second magnetoresistance elements 12, 13, the second interlayer coupling magnetic field Hin2 is the negative value and in this case, an interaction which makes the opposite magnetizations to be anti-parallel act between the fixed magnetic layer 33 and the free magnetic layer 37. By generating the exchange coupling magnetic field in the same direction by heat treatment on the magnetic field between the anti-ferromagnetic layer 32 and the fixed magnetic layer 33 of the magnetoresistance elements 10 to 13, the magnetization 33a of the fixed magnetic layer 33 of the magnetoresistance elements 10 to 13 can be fixed in the same direction. Further, since the above-mentioned interaction acts between the fixed magnetic layer 33 and the free magnetic layers 35, 37, the magnetization state in FIG. 9 is formed.

In the embodiment, an increasing or decreasing tendency of the resistance value with the variation in magnetic field magnitude of the external magnetic field H1 in the positive direction of the first magnetoresistance element 10, 11 is opposite to an increasing or decreasing tendency of the resistance value with the variation in magnetic field magnitude of the external magnetic field H2 in the negative direction of the second magnetoresistance elements 12, 13 with respect to a non-magnetic field state of the external magnetic field. That is, in the first magnetoresistance elements 10, 11, the resistance value R gradually tends to increase as the external magnetic field H1 in the positive direction from the non-magnetic state increases. In the second magnetoresistance elements 12, 13, the resistance value R gradually tends to decrease as the external magnetic field H2 (absolute value) in the negative direction from the non-magnetic state increases.

For the reason, when the external magnetic field H1 in the positive direction gradually increases, the potential of the first output terminal 18 shown in FIG. 6 gradually decreases, and the potential of the second output terminal 19 shown in FIG. 6 gradually increases. Likewise, when the external magnetic field H2 (absolute value) in the negative direction gradually increases, the potential of the first output terminal 18 shown in FIG. 8 gradually decreases and the potential of the second output terminal 19 shown in FIG. 8 gradually increases. Accordingly, as shown in FIGS. 6 and 8, once a general bridge circuit is formed, the control unit 21 can perform the same control whether the external magnetic field is in the positive direction or in the negative direction, and particularly, it is not required to change a circuit or a control method in accordance with the polarity of the external magnetic field.

In the embodiment, as shown in FIG. 5, an element length of the first magnetoresistance elements 10, 11 is L1, and an element length of the second magnetoresistance elements 12, 13 is L2. The element length L1 is shorter than the element length L2. Accordingly, as shown in FIG. 10C, the resistance value R of the first magnetoresistance elements 10, 11 in the non-magnetic state (zero) of the external magnetic field H is smaller than the resistance value R of the second magnetoresistance elements 12, 13. The element resistance may vary by varying a cross section, a material, or a film configuration. In order to suppress non-uniform of the temperature coefficient (TCR) by simple manufacturing method, it is proper that the cross section, the material, or the film configuration is equal between the first magnetoresistance elements 10, 11 and the second magnetoresistance elements 12, 13. Accordingly, film thicknesses or materials of the layers of the first magnetoresistance elements 10, 11 is the same as the second magnetoresistance elements 12, 13. However, in order to vary the interlayer coupling magnetic field Hin, to vary the film thickness of the non-magnetic intermediate layer 34 is not excluded. The first magnetoresistance elements 10, 11 and the second magnetoresistance 12, 13 are formed to have the same film configuration. For example, when the fixed magnetic layer 33 of the first magnetoresistance elements 10, 11 is formed of an artificial ferri structure, the fixed magnetic layer 33 of the second magnetoresistance elements 12, 13 also is formed of the artificial ferri structure.

In the embodiment, the manufacturing method is also simple. That is, since conditions for the plasma treatment on the non-magnetic intermediate layer 34 may vary, at least the first magnetoresistance elements 10, 11 and the second magnetoresistance element 12, 13 can be manufactured in the same process as the non-magnetic intermediate layer 34. Since the fixed magnetic layer 33 of the first magnetoresistance elements 10, 11 and the fixed magnetic layer 33 of the second magnetoresistance element 12, 13 are fixed in the same magnetization direction 33a, the direction of the magnetic field during the heat treatment in a magnetic field can be matched, and the heat treatment in a magnetic field can be simultaneously performed on the first magnetoresistance elements 10, 11 and the second magnetoresistance element 12, 13.

As shown in FIG. 10C, when the external magnetic field H1 in the positive direction acts, the fixed resistance value X1 of the second magnetoresistance elements 12, 13 is larger than the minimum resistance value X2 of the first magnetoresistance elements 10, 11 varying with the variation in magnetic field magnitude in the positive direction, and is smaller than the maximum resistance value X3 thereof. When the external magnetic field H2 in the negative direction acts, the fixed resistance value X4 of the first magnetoresistance elements 10, 11 is larger than the minimum resistance value X5 of the second magnetoresistance elements 12, 13 varying with the variation in magnetic field magnitude in the negative direction, and is smaller than the maximum resistance value X6 thereof. As shown in FIG. 10C, a ratio of 'fixed resistance value X1—minimum resistance value X2 to maximum resistance value X3—fixed resistance value X1' is equal to a ratio of ' maximum resistance value X6—fixed resistance value X4 to fixed resistance value X4—minimum resistance value X5'.

In the embodiment, the magnitude of the first interlayer coupling magnetic field Hin1 is equal to the magnitude (absolute value) of the second interlayer coupling magnetic field Hin2.

In the embodiment, as shown in FIGS. 6 and 8, the output terminals 18, 19 are connected to the differential amplifier 20, and a relation between the differential potential from the differential amplifier 20 and the external magnetic field H is presented as the curves D and F shown in FIG. 11.

As shown in FIG. 11, when the external magnetic field H is in the non-magnetic field state (zero), the differential potential is T1, which, for example, is a positive value (it is possible to be a negative value by the control of the differential amplifier 20, but it is described as a positive value). When the external magnetic field H1 in the positive direction increases, as shown in FIG. 10c, the resistance value R of the first magnetoresistance elements 10, 11 increases, the second magnetoresistance elements 12, 13 function as the fixed resistance element, and the differential potential gradually decreases as a curve D shown in FIG. 11. In the embodiment, the fixed resistance value X1 of the second magnetoresistance elements 12, 13 is in the range of the minimum resistance value X2 and the maximum resistance value X3 of the first magnetoresistance elements 10, 11. Accordingly, when the external magnetic field H1 increases up to H1-A (refer to FIG. 11), the varying resistance value R of the first magnetoresistance elements 10, 11 is matched with the fixed resistance value X1 of the second magnetoresistance elements 12, 13, whereby the differential potential becomes zero.

When the external magnetic field H2 (absolute value) in the negative direction gradually increases, as shown in FIG. 10c, the resistance value R of the second magnetoresistance elements 12, 13 increases, the first magnetoresistance elements 10, 11 function as the fixed resistance element, and the differential potential gradually decreases as a curve F shown in FIG. 11. In the embodiment, the fixed resistance value X4 of the first magnetoresistance elements 10, 11 is in the range of the minimum resistance value X5 and the maximum resistance value X6 of the second magnetoresistance elements 12, 13. Accordingly, when the external magnetic field H2 increases up to H1-B (refer to FIG. 11), the varying resistance value R of the second magnetoresistance elements 12, 13 is matched with the fixed resistance value X4 of the first magnetoresistance elements 10, 11, whereby the differential potential becomes zero.

In the embodiment, when the external magnetic field H1 in the positive direction acts, there is a time when a varying resistance value R of the first magnetoresistance elements 10, 11 and the fixed resistance value X1 of the second magnetoresistance elements 12, 13 are equal to each other and become zero. Similarly, when the external magnetic field H2 in the negative direction acts, there is a time when a varying resistance value R of the second magnetoresistance elements 12, 13 and the fixed resistance value X4 of the first magnetoresistance elements 10, 11 are equal to each other and become zero. A potential at this time is a threshold potential. In the control unit 21, a comparison unit comparing the threshold potential with the differential potential which changes every moment is provided. When the differential potential is matched with the threshold potential, that is, when the differential potential becomes zero, the control unit 21 can switch the on-off signals.

In the embodiment, as described above, a ratio of 'fixed resistance value X1—minimum resistance value X2 to maximum resistance value X3—fixed resistance value X1' is equal to a ratio of 'maximum resistance value X6—fixed resistance value X4 to fixed resistance value X4—minimum resistance value X5'. Since the first interlayer coupling magnetic field Hin1 and the second interlayer coupling magnetic field Hin2 (absolute value) are the same in magnitude, as shown in FIG. 11, a magnitude H1-A of the external magnetic field H1 in the positive direction at the time when the differential potential becomes zero may be equal to a magnitude H2-B of the external magnetic field H2 in the negative direction. In addition, when the threshold potential other than zero is used as a threshold potential, as shown in FIG. 11, the magnitude of the external magnetic field with the threshold potential varies between the positive direction and the negative direction. Accordingly, it is preferable that the differential potential with zero is used as a threshold potential.

For example, when the ratios or the magnitudes of the first interlayer coupling magnetic field Hin1 and the second interlayer coupling magnetic field Hin2 (absolute value) are different from each other and the differential potential is zero, the external magnetic field H1 in the positive direction is not equal to the external magnetic field H2 in the negative direction. Accordingly, in order to output the switching signal with the same magnitude of the external magnetic field in the positive direction and the negative direction, it is necessary to individually adjust the threshold potentials in the external magnetic fields H1, H2 in the positive direction and the negative direction in consideration of an offset.

When the fixed resistance value X1 the second magnetoresistance elements 12, 13 in the external magnetic field H1 in the positive direction do not intersect the hysteresis loop HR-A of the first magnetoresistance elements 10, 11, and when the fixed resistance value X4 the second magnetoresistance elements 10, 11 in the external magnetic field H2 in the negative direction do not intersect the hysteresis loop HR-B of the second magnetoresistance elements 12, 13, as shown in curves G, H with a dashed-doted line in FIG. 11, a line in which the differential potential is zero can not be used as the threshold potential. Accordingly, it is necessary to individually adjust the threshold potentials in consideration of an offset from the differential potential with zero.

Meanwhile, in the embodiment, since the differential potential with zero is used as the threshold potential, the magnitude H1-A of the external magnetic field in the positive direction with the threshold potential can be equal to the magnitude H2-B of the external magnetic field in the negative direction. Accordingly, it is simple to adjust the threshold potential. That is, in the embodiment, a time for outputting an on-signal by opening the cellular phone shown in FIGS. 1 and 2 (or a time for outputting an off-signal by opening the cellular phone) when the external magnetic field H1 in the positive direction acts on the magnetic sensor 4 as shown in FIGS. 1 and 2, may be equal to a time for outputting an on-signal by opening the cellular phone shown in FIGS. 3 and 4 (or a time for outputting an off-signal by opening the cellular phone) when the external magnetic field H2 in the negative direction acts on the magnetic sensor 4 as shown in FIGS. 3 and 4. In the embodiment as described above, although the polarities of the external magnetic field H are different each other, the magnetic sensor 4 which can be driven in a stable manner can be provided by a simple circuit.

In the embodiment, it is further preferable that the fixed resistance value X1 is a value between the minimum resistance value X2, and the maximum resistance value X3 and the fixed resistance value X4 is a value between the minimum resistance value X5 and the maximum resistance value X6. Thus, when the on-off signal is switched, the magnitude of the external magnetic field can be adjusted to be the same in the positive direction and the negative direction. Accordingly, the magnetic sensor 4 adapted for the both positive and negative magnetic fields is driven in a stable manner.

Figure 13:
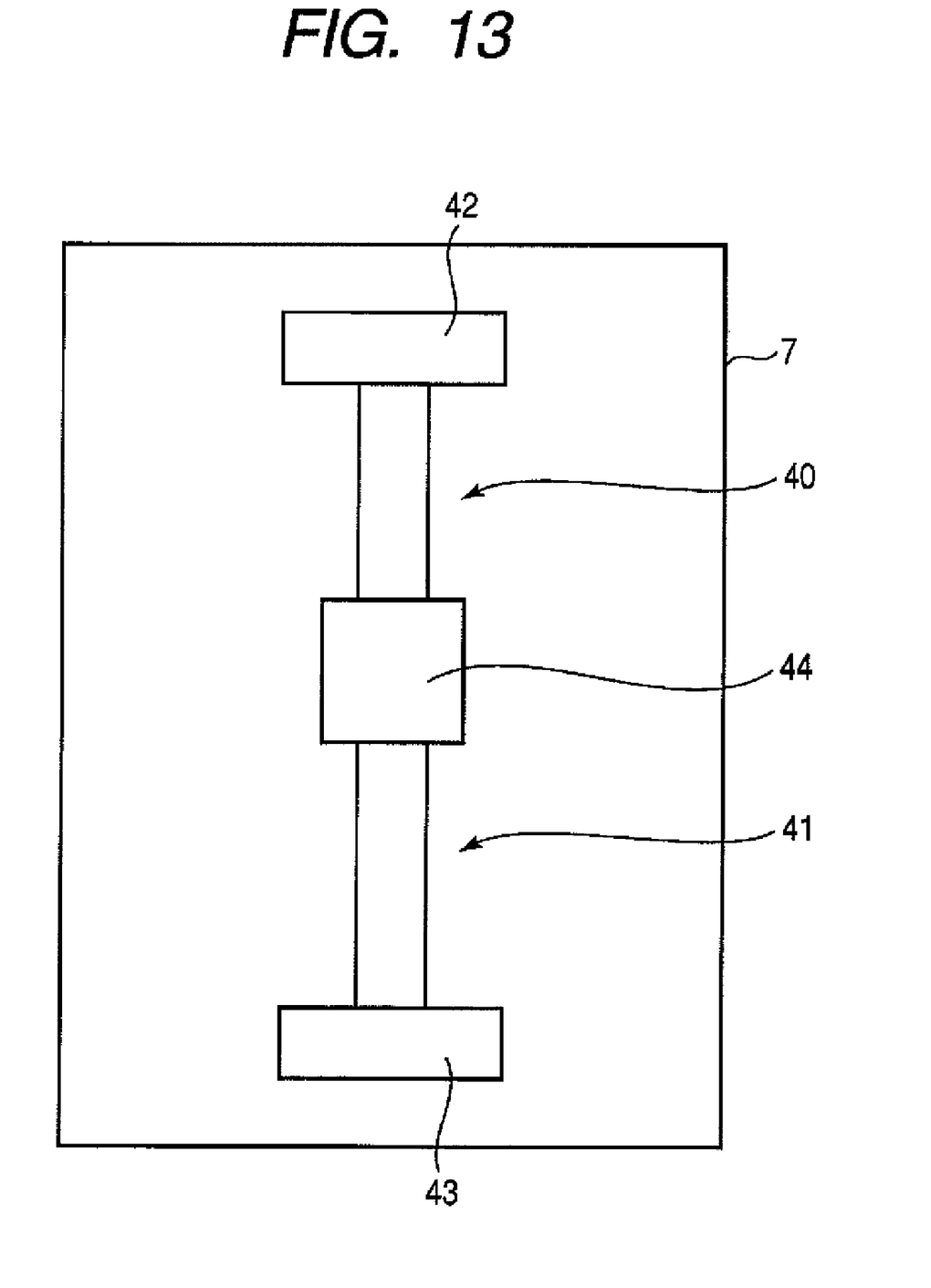
FIG. 13 is a partially sectional view of another embodiment.
Figure 14:
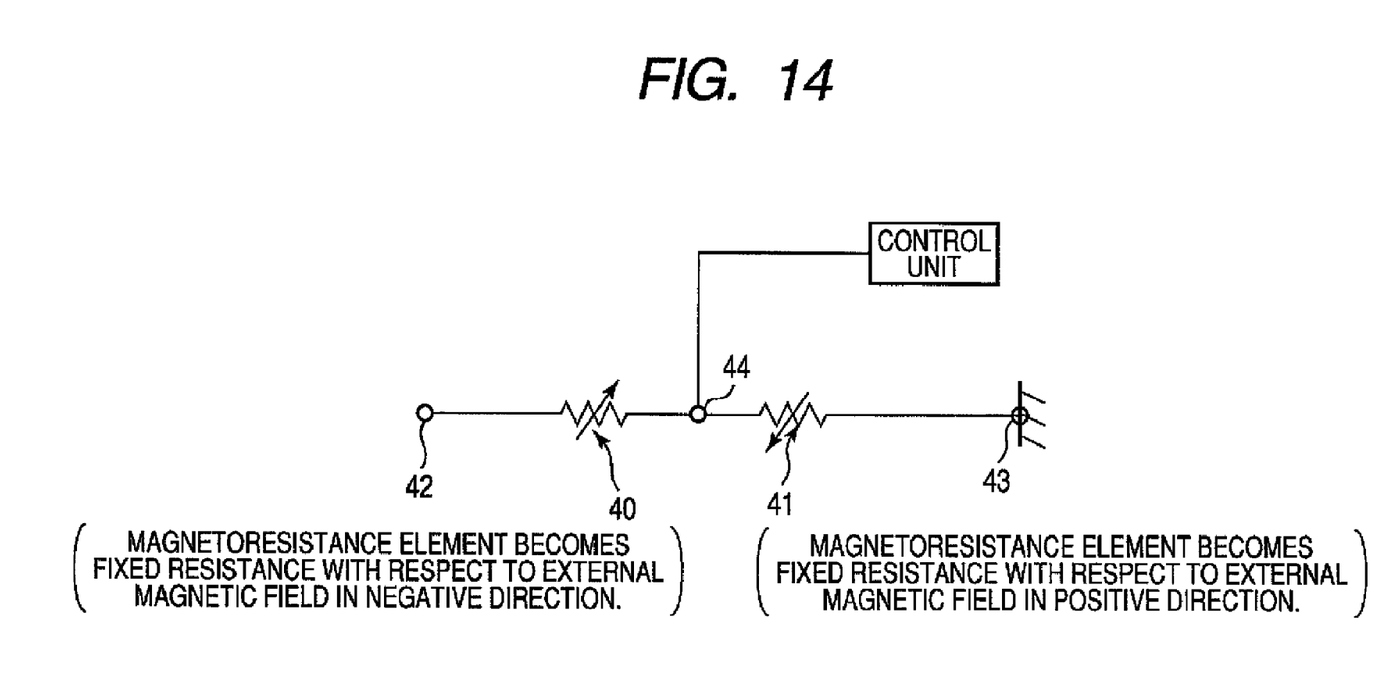
FIG. 14 is a circuit diagram of a magnetic sensor shown in FIG. 13.

FIG. 13 is a plan view illustrating another embodiment of FIGS. 5 and 6. FIG. 14 is a circuit diagram of FIG. 13.

In FIG. 13, one first magnetoresistance element 40 and one second magnetoresistance element 41 are provided, and the first magnetoresistance element 40 and the second magnetoresistance 41 are connected in series. An end portion of the first magnetoresistance element 40 is connected to an input terminal 42, an end portion of the second magnetoresistance element 41 is connected to an earth terminal 43, and an output terminal 44 is connected to the connecting portion between the first magnetoresistance element 40 and the second magnetoresistance element 41.

The first magnetoresistance element 40 has the hysteresis characteristic shown in FIG. 10A and the second magnetoresistance element 41 has the hysteresis characteristic shown in FIG. 10B. Thus, with the variation in magnetic field magnitude of the external magnetic field H1 in the positive direction, the first magnetoresistance element 40 varies in resistance, and the second magnetoresistance element 41 does not vary. With the variation in magnetic field magnitude of the external magnetic field H2 in the negative direction, the second magnetoresistance 41 varies in resistance and the first magnetoresistance element 40 does not vary, thereby forming the magnetic sensor adapted for both the positive and negative magnetic fields. Accordingly, assembly is easy.

A preferable film configuration or hysteresis characteristic of the first magnetoresistance 40 and the second magnetoresistance 41 is the same as the above-described bridge circuit.

An example of the specific numerical value is described. A length L1 of the first magnetoresistance elements 10, 11, and 40 is about 1700 μm, a length L2 of the second magnetoresistance element 12, 13, and 41 is about 1700 μm, a film thickness of the non-magnetic intermediate layer 34 of the first magnetoresistance elements 10, 11, and 40 is in the range of 19 to 23 μm, and a film thickness of the non-magnetic intermediate layer 34 of the second magnetoresistance elements 12, 13, and 41 is in the range of 19 to 23 μm.

A requirement of the plasma treatment, for example, is that an electric power value is about 130 W, an Ar gas pressure is about 45 mTorr (about 6 Pa), and a treatment time is about 60 seconds.

In an adjustment of the interlayer coupling magnetic field Hin, when the plasma treatment is performed on one magnetoresistance element and thus the interlayer coupling magnetic field shifting in the negative direction is obtained, a film thickness of the anti-ferromagnetic layer of the other magnetoresistance element is adjusted in the range of 50 to 200 Å, and thus the interlayer coupling magnetic field shifted in the positive direction is obtained. A surface state varies in accordance with the adjustment for the film thickness of the anti-ferromagnetic layer, whereby the interlayer coupling magnetic field varies.

The first interlayer coupling magnetic field Hin1 is in the range of 7.5 to 17.5 Oe, the second interlayer coupling magnetic field Hin2 is in the range of −17.5 to −7.5 Oe, and the magnitude of the external magnetic field H in the range for use is in the range of −100 to 100 Oe.

As mentioned above, although the magnetic sensor 4 in the embodiment is used for the open and close detection of the foldable cellular phone 1, the magnetic sensor 4 may be used for the open and close detection of a portable electronic apparatus such as a game machine. The embodiment, in addition to the open and close detection, may be used in a field for which the magnetic sensor 4 adapted for the both positive and negative magnetic fields is necessary.

It is optional whether a bias magnetic field is applied to the magnetoresistance element. Although the bias magnetic field may be not supplied to the free magnetic layer constituting the magnetoresistance element, it should be adjusted so as to be in the magnetization state shown in FIG. 9 when the bias magnetic is not supplied.

The magnetoresistance element may have a meandering shape in addition to a straight line shape and is not limited in a shape.

Further, a "magnetic sensor" may be one in which the magnetic sensor 4 and the magnet (external magnetic field generating means) 5 as a sensor unit are formed in a set or one in which the only magnetic sensor 4 as a sensor unit is formed.

What is claimed is:

1. A magnetic sensor comprising:
   a series circuit having a first magnetoresistance element and a second magnetoresistance element,
   a connecting portion that connects the first magnetoresistance element and the second magnetoresistance element, the connecting portion is operable to output a potential level,
   wherein resistance values vary with a variation in magnetic field magnitude of an external magnetic field,
   wherein when a direction of the external magnetic field is a positive direction and a direction opposite to the positive direction is a negative direction, a resistance value of the first magnetoresistance element varies and the resistance value of the second magnetoresistance element does not vary with a variation in magnetic field magnitude of the external magnetic field in the positive direction,
   wherein the resistance value of the second magnetoresistance element varies and a resistance value of the first magnetoresistance does not vary with a variation in magnetic field magnitude of the external magnetic field in the negative direction; and
   wherein an increasing or decreasing tendency of the resistance variation of the first magnetoresistance element with the variation in magnetic field magnitude in the positive direction is opposite to an increasing or decreasing tendency of the resistance variation of the second magnetoresistance element with the variation in magnetic field magnitude in the negative direction, with respect to a non-magnetic field state of the external magnetic field.

2. The magnetic sensor according to claim 1 wherein two first magnetoresistance elements and two second magnetoresistance elements are provided, one first magnetoresistance element and one second magnetoresistance element constitute a first series circuit, and the other first magnetoresistance element and the other second magnetoresistance element constitute a second series circuit,
   wherein the first magnetoresistance element of the first series circuit and the second magnetoresistance element of the second series circuit are connected in parallel and the second magnetoresistance element of the first series circuit and the first magnetoresistance element of the second series circuit are connected in parallel, and
   wherein a difference between a potential of the connecting portion in the first series circuit and a potential of the connecting portion in the second series circuit is outputted as a differential voltage.

3. The magnetic sensor according to claim 1, wherein when the external magnetic field is in the positive direction, a fixed resistance value X1 of the second magnetoresistance element is lager than a minimum resistance value X2 of the first magnetoresistance element varying with a variation in magnetic field magnitude in the positive direction, and is smaller than a maximum resistance value X3,
   wherein when the external magnetic field is in the negative direction, a fixed resistance value X4 of the first magnetoresistance element is larger than a minimum resistance value X5 of the second magnetoresistance element varying with a variation in magnetic field magnitude in the negative direction, and is smaller than a maximum resistance value X6, and wherein a ratio of 'fixed resistance value X1—minimum resistance value X2 to maximum resistance value X3—fixed resistance value X1' is equal to a ratio of 'maximum resistance value X6—fixed resistance value X4 to fixed resistance value X4—minimum resistance value X5'.

4. The magnetic sensor according to claim 3, wherein the fixed resistance value X1 is a value between the minimum resistance value X2 and the maximum resistance value X3, and the fixed resistance value X4 is a value between the minimum resistance value X5 and the maximum resistance value X6.

5. The magnetic sensor according to claim 1 wherein the first magnetoresistance element and the second magnetoresistance element have the same film configuration having an anti-ferromagnetic layer, a fixed magnetic layer, a non-magnetic intermediate layer, and a free magnetic layer, wherein in an R-H curve in which a transverse axis denotes an external magnetic field and a longitudinal axis denotes a resistance value of a magnetoresistance element, a first interlayer-coupling magnetic field Hin1 acting between the fixed magnetic layer and free magnetic layer of the first magnetoresistance element is shifted in the positive direction of the external magnetic field, and a second interlayer-coupling magnetic field Hin2 acting between the fixed magnetic layer and the free magnetic layer of the second magnetoresistance element is shifted in the negative direction.

6. The magnetic sensor according to claim 5, wherein the first interlayer-coupling magnetic field Hin1 and the second interlayer-coupling magnetic field Hin2 (absolute value) have the same magnitude.

7. The magnetic sensor according to claim 5, wherein in the non-magnetic state of the external magnetic field, a magnetization of the fixed magnetic layer and a magnetization of a free magnetic layer of one of the first magnetoresistance element and the second magnetoresistance element are in the same direction, a magnetization of the fixed magnetic layer and a magnetization of the free magnetic layer of the other are in an anti-parallel state, and a magnetization of the fixed magnetic layer of the first magnetoresistance element and a magnetization of the fixed magnetic layer of the second magnetoresistance element are in the same direction.

* * * * *